(12) United States Patent
Kim (10) Patent No.: US 8,080,840 B2
(45) Date of Patent: Dec. 20, 2011

(54) IMAGE SENSOR AND MANUFACTURING METHOD OF IMAGE SENSOR

(75) Inventor: Jong Man Kim, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 162 days.

(21) Appl. No.: 12/563,276

(22) Filed: Sep. 21, 2009

(65) Prior Publication Data
US 2010/0078751 A1   Apr. 1, 2010

(30) Foreign Application Priority Data
Sep. 30, 2008 (KR) .................. 10-2008-0096108

(51) Int. Cl.
*H01L 31/03* (2006.01)
(52) U.S. Cl. ........ 257/292; 257/290; 257/293; 257/294; 257/444; 257/458; 257/656; 257/E32.057
(58) Field of Classification Search .................. 257/290, 257/292–294, 444, 458, 659, E31.103
See application file for complete search history.

(56) References Cited

U.S. PATENT DOCUMENTS
2003/0213915 A1* 11/2003 Chao et al. ............... 250/370.14
* cited by examiner

*Primary Examiner* — Cuong Q Nguyen
*Assistant Examiner* — Tran Tran
(74) *Attorney, Agent, or Firm* — Saliwanchik, Lloyd & Eisenschenk (57) ABSTRACT

Disclosed are an image sensor and a method for manufacturing the same. The image sensor can include a readout circuitry on a first substrate; an interlayer dielectric layer including at least one metal and contact plug electrically connected to the readout circuitry; and an image sensing device formed on a second substrate, bonded to the interlayer dielectric layer, and provided with a first conductive type conduction layer and a second conductive type conduction layer. An uppermost contact plug in the interlayer dielectric layer has a wall structure extending from an uppermost metal in the interlayer dielectric layer. The top surface of the uppermost contact plug makes contact with the image sensing device and is connected to an image sensing device and an uppermost metal of an adjacent pixel.

9 Claims, 5 Drawing Sheets

IMAGE SENSOR AND MANUFACTURING METHOD OF IMAGE SENSOR

CROSS-REFERENCE TO RELATED APPLICATION

This application claims the benefit under 35 U.S.C. §119 of Korean Patent Application No. 10-2008-0096108, filed Sep. 30, 2008, which is hereby incorporated by reference in its entirety.

BACKGROUND

In general, an image sensor is a semiconductor device for converting optical images into electric signals, and is classified into a charge coupled device (CCD) image sensor and a complementary metal oxide semiconductor (CMOS) image sensor (CIS).

According to the related art, a photodiode (PD) is formed on a substrate by implanting ions into the substrate. However, as the size of the PD is gradually decreased such that the number of pixels is increased without the increase of a chip size, the size of a light receiving part is reduced so that an image quality may be degraded.

In addition, there has been suggested a method for increasing the electron generation rate by increasing capacitance of the PD. However, expanding a depletion region of the PD to increase the capacitance is limited, and the light aperture ratio may be lowered due to the structure formed in the back end process of the PD.

As an alternative method to overcome the above problems, there has been suggested a method of forming the PD by depositing amorphous silicon (Si). In addition, there has been suggested a structure, in which a readout circuitry is formed on a Si-substrate (main substrate) through a wafer-to-wafer bonding scheme, and the PD is formed on another substrate (donor substrate) provided on the readout circuitry (hereinafter, referred to as "PD-up CIS" or "three dimensional (3D) image sensor").

Such a structure can be obtained by bonding the donor substrate with the main substrate after sequentially forming a p+ area, an n− area, and an n+ area on a PD region of the donor substrate.

According to the above structure, the light aperture ratio can be improved and the depletion region (p-area) of the PD can be expanded. Thus, higher capacitance can be achieved, resulting in a higher electron generation rate being obtained.

However, defects may occur in the process of bonding the donor substrate with the main substrate. For instance, a contact defect may occur in a contact plug, which connects the PD of the donor substrate with metal, or the insulating property may be degraded between components of the Si-substrate.

In this case, current generated from the PD of the donor substrate may not be easily transferred to the readout circuitry of the main substrate due to high resistance of about $10^5\Omega$ to $10^8\Omega$, so the operational reliability of the image sensor may be degraded.

BRIEF SUMMARY

Embodiments of the present invention provide a vertical type three-dimensional image sensor and a method for manufacturing the same, in which a donor substrate is bonded to a main substrate while ensuring stable electric connection therebetween.

An image sensor according to an embodiment includes a readout circuitry on a first substrate; an interlayer dielectric layer including at least one metal and contact plug electrically connected to the readout circuitry; and an image sensing device formed on a second substrate, bonded to the interlayer dielectric layer, and provided with a first conductive type conduction layer and a second conductive type conduction layer; wherein an uppermost contact plug of the at least one contact plug in the interlayer dielectric layer has a wall structure extending from an uppermost metal of the at least one metal, and wherein the top surface of the uppermost contact plug makes contact with the image sensing device and is connected to a second image sensing device and a second uppermost metal of an adjacent pixel.

A method for forming the image sensor according to an embodiment includes forming a readout circuitry on a first substrate; forming an interlayer dielectric layer including at least one metal and contact plug electrically connected to the readout circuitry; forming an uppermost contact plug having a wall structure in the interlayer dielectric layer such that the uppermost contact plug extends from an uppermost metal of the at least one metal and the bottom surface of the uppermost contact plug is exposed to a surface of the interlayer dielectric layer and is electrically connected to a second uppermost metal of an adjacent pixel; and bonding a second substrate having an image sensing device including a first conductive type conduction layer and a second conductive type conduction layer onto the interlayer dielectric layer such that the first conductive type conduction layer faces the interlayer dielectric layer.

DETAILED DESCRIPTION

Hereinafter, an image sensor and a method for manufacturing the same according to embodiments will be described in detail with reference to accompanying drawings.

Detailed description about well-known functions or configurations may make the subject matter of the disclosure unclear. Accordingly, hereinafter, description will be made regarding only essential components directly related to the technical scope of the disclosure.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Although the embodiments will be described with reference to a CMOS image sensor, the embodiments are not limited to the CMOS image sensor, but are applicable for various image sensors having photodiodes.

The doping symbols shown in Table I will be used in the following description.

TABLE 1

| | Doping symbols | | | | |
|---|---|---|---|---|---|
| | n++/p++ | n+/p+ | n0/p0 | n−/p− | n−−/p−− |
| Doping level L (number/cm$^3$) | L > 1$^{19}$ | 1$^{19}$ ≧ L > 1$^{18}$ | L = 1$^{18}$ | 1$^{18}$ > L ≧ 1$^{17}$ | L < 1$^{17}$ |

Figure 1:
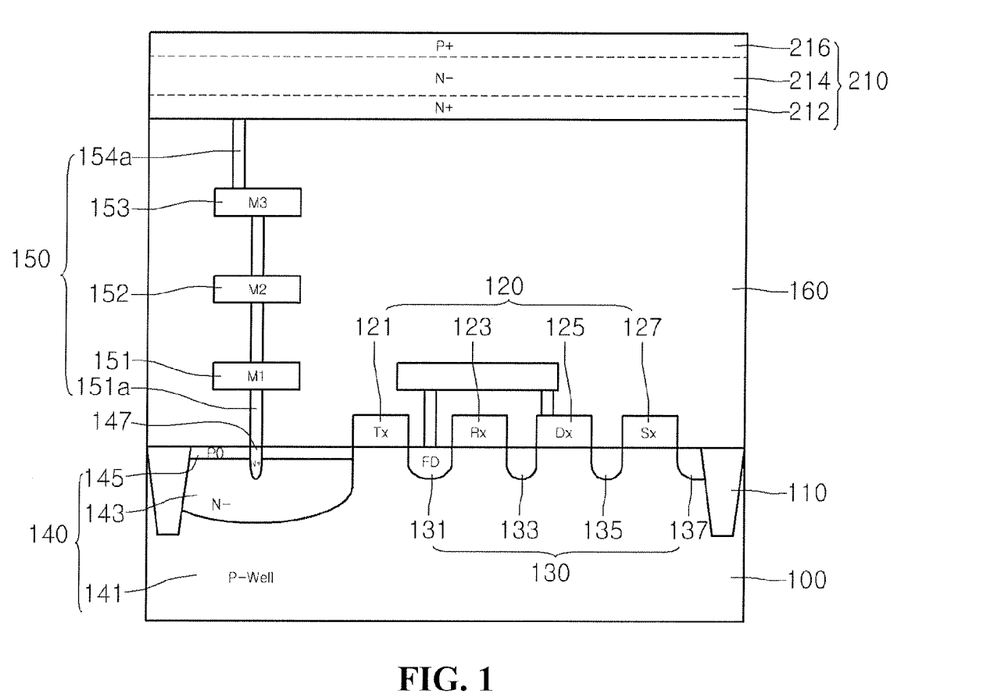
FIG. 1 is a cross-sectional view showing the structure of an image sensor according to a first embodiment.

Referring to FIG. 1, the image sensor according to a first embodiment includes a readout circuitry 120 formed on a first substrate 100, an electric junction area 140 formed on the first substrate 100 and electrically connected to the readout circuitry 120, an interconnection 150 electrically connected to the electric junction area 140, and an image sensing device (from second substrate) 210 formed on the interconnection 150.

The image sensing device 210 may include a photodiode, but embodiments are not limited thereto. For instance, the image sensing device 210 may include a photo gate or a combination of the photodiode and the photo gate. Although the first embodiment will be described in that the photodiode 210 is formed on the crystalline semiconductor layer, the first embodiment is not limited thereto. For instance, the photodiode 210 can be formed of an amorphous semiconductor layer.

Reference numbers shown in FIG. 1 will be further explained in the description of the method for manufacturing the image sensor. Hereinafter, a method for manufacturing the image sensor according to the first embodiment will be described with reference to FIGS. 2 to 7.

Figure 2:
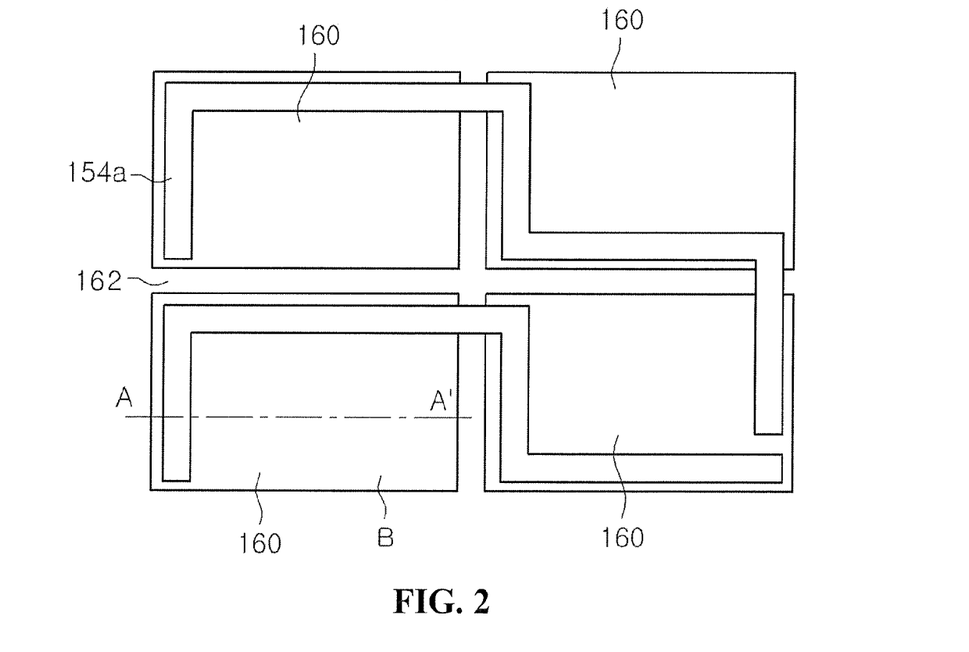
FIG. 2 is a plan view showing uppermost contact plugs formed over photodiodes of pixels according to an embodiment.
Figure 3:
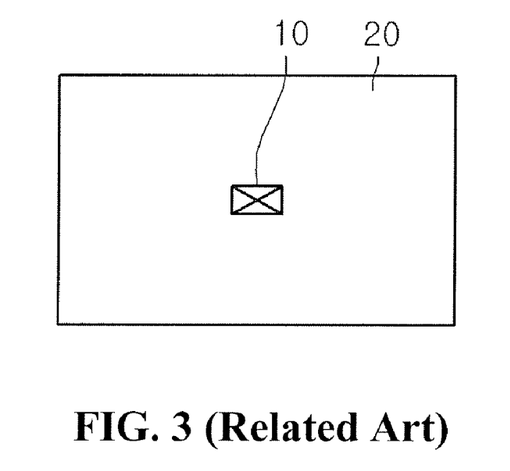
FIG. 3 is a plan view showing uppermost contact plugs connected to photodiodes according to the related art.
Figure 4:
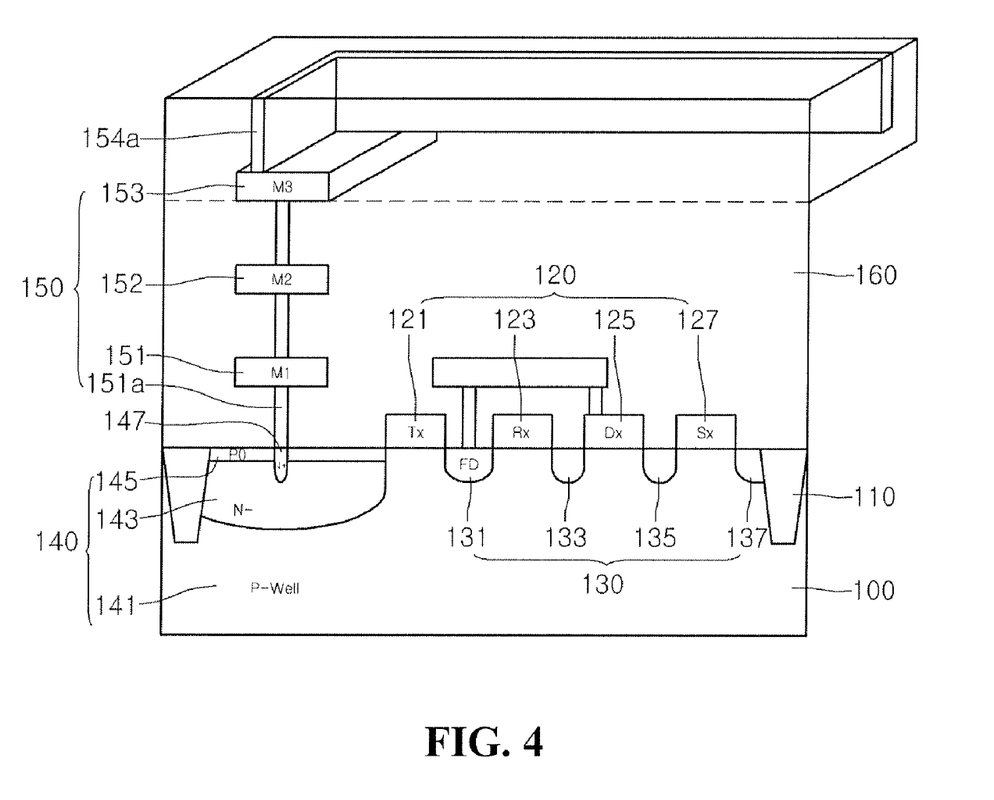
FIG. 4 is a sectional view of an embodiment showing the structure of an image sensor after an interlayer dielectric layer has been formed.

FIG. 2 is a plan view showing uppermost contact plugs 154a formed over photodiodes of pixels, FIG. 3 is a plan view showing uppermost contact plugs 10 connected to photodiodes according to the related art, and FIG. 4 is a side sectional view showing the structure of the image sensor after an interlayer dielectric layer 160 has been formed.

Figure 7:
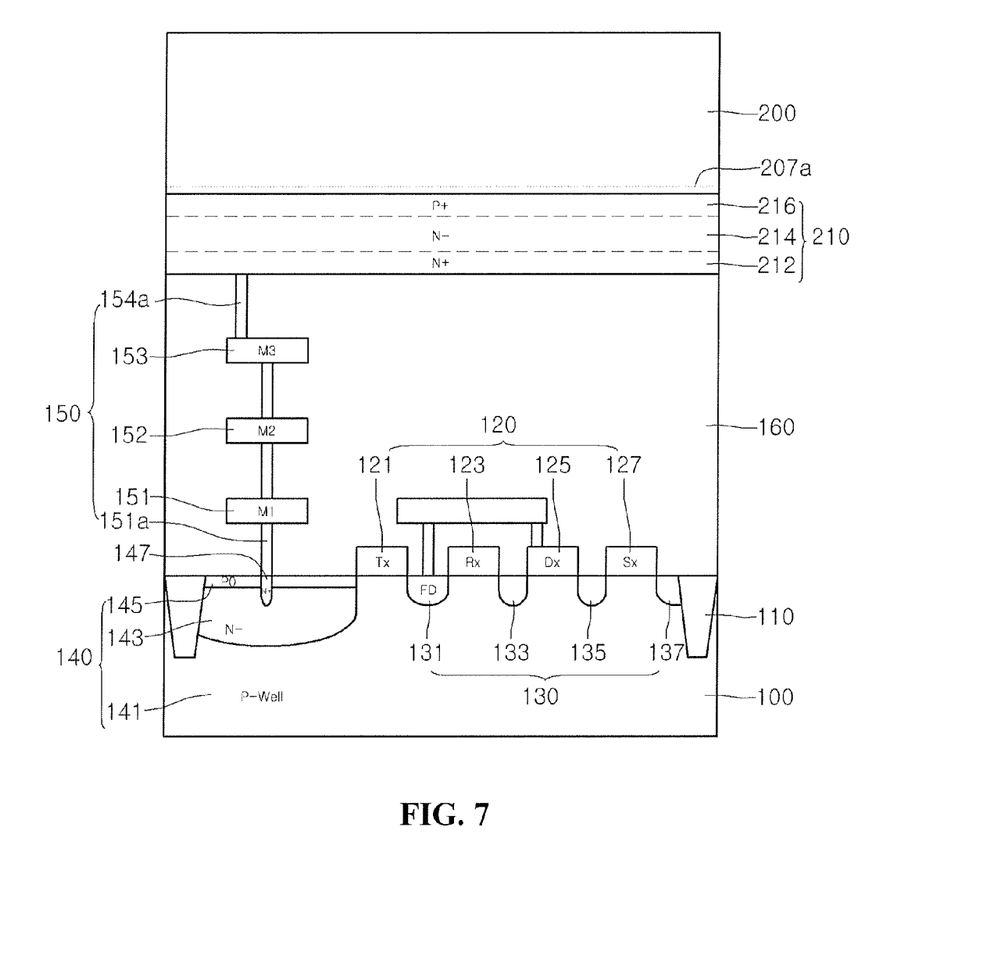
FIG. 7 is a cross-sectional view of an embodiment showing the structure of an image sensor after a first substrate has been bonded to a second substrate.

The structure of the image sensor shown in FIGS. 1, 4 and 7 corresponds to one pixel and is provided in one of four photodiode areas shown in FIG. 2.

FIG. 2 is a plan view of the uppermost contact plugs 154a, which are provided in the form of walls in the interlayer dielectric layers 160 on the photodiode areas before the second substrate having the photodiode 210 is bonded. In FIG. 2, each photodiode area is defined by an isolation area 162, such as a PTI (pixel trench isolation).

FIGS. 1, 4 and 7 are cross-sectional views taken along line A-A' of FIG. 2. It should be noted that the arrangement of the transistors of the readout circuitry 120 may not actually be located or visible along the line A-A', but are illustrated for ease of description.

As shown in FIG. 3, according to the related art, in the interlayer dielectric layer 20, one uppermost contact plug 10 having a column structure is formed for each photodiode (pixel) area. In contrast, according to an embodiment, multiple photodiode (pixel) areas are connected to each other by uppermost contact plugs 154 prepared in the form of walls.

As shown in FIG. 4, the first substrate (main substrate) 100 formed with the readout circuitry 120 is prepared. For instance, an isolation layer 110 is formed on a second conductive type first substrate 100 to define the active area, and the readout circuitry 120 including transistors is formed on the active area. The readout circuitry 120 may include a transfer transistor Tx 121, a reset transistor Rx 123, a drive transistor Dx 125 and a select transistor Sx 127. Then, an ion implantation area 130 including a floating diffusion area 131 and source/drain areas 133, 135 and 137 for the transistors can be formed. In addition, according to the first embodiment, a noise removal circuitry (not shown) can be formed to improve sensitivity.

The step of forming the readout circuit 120 on the first substrate 100 may include the steps of forming the electric junction area 140 on the first substrate 100 and forming a first conductive type connection region 147, which is connected to the interconnection 150, on the electric junction area 140.

For instance, the electric junction area 140 may include a PN junction, but embodiments are not limited thereto. The electric junction area 140 may include a first conductive type ion implantation area 143 formed on a second conductive type well 141 or a second conductive type epitaxial layer, and a second conductive ion implantation area 145 formed on the first conductive ion implantation area 143. For example, as shown in FIG. 2, the PN junction area 140 may include a P0-/N-/P- junction, but embodiments are not limited thereto. The first substrate 100 may be a second conductive type substrate, but embodiments are not limited thereto.

According to the first embodiment, the device is designed such that a potential difference may exist between source/drains areas of the transfer transistor Tx such that photo charges can be fully dumped. In this case, the photo charges generated from the photodiode are dumped into the floating diffusion area, so that sensitivity of the output image can be maximized.

That is, according to the first embodiment, the electric junction area 140 is formed on the first substrate 100 having the readout circuitry 120, so that potential difference is generated between the source/drain areas at sides of the transfer transistor Tx, thereby allowing the photo charges to be fully dumped.

Hereinafter, the photo charge dumping structure according to the first embodiment will be described in detail.

Unlike a node of the floating diffusion region FD 131, which may be an N+ junction, in the first embodiment, voltage may not be fully applied to the P/N/P junction serving as the electric junction area 140 and may be pinched-off at a predetermined voltage. This voltage is called a pinning voltage. The pinning voltage depends on doping concentrations of the P0 region 145 and the N− region 143.

In detail, electrons generated from the photodiode 210 are moved to the PNP junction 140, and then transferred to the node of the floating diffusion region FD 131 when the transfer transistor Tx 121 is turned on or the electrons are converted into a voltage.

Since a maximum voltage value of the P0/N−/P− junction 140 may become a pinning voltage, and a maximum voltage value of the node of the floating diffusion region FD 131 may become Vdd minus the threshold voltage Vth of Rx 123, electrons generated from the photodiode 210 formed on an upper portion of a chip may be fully dumped to the node of the floating diffusion region FD 131. This may be done without charge sharing due to the potential difference between both ends of the transfer transistor Tx 121.

That is, according to the first embodiment, a P0/N−/P-well junction, not an N+/P-well junction, may be formed on the silicon substrate serving as the first substrate 100. Since a positive (+) voltage is applied to the N− area 143 of the P0/N−/P-well junction and a ground voltage is applied to the P0 area 145 and the P-well 141 during the 4-Tr APS (active pixel sensor) reset operation, a pinch-off may be generated to the P0/N−/P-well double junction at a predetermined voltage or more. This may be similar to a bipolar junction transistor (BJT) structure and called a pinning voltage. Thus, the potential difference may be generated between source and drain areas of the transfer transistor Tx 121, thereby inhibiting the charge sharing during the on/off operations of transfer transistor Tx 121.

Therefore, unlike the related art where the photodiode may be simply connected to the N+ junction, problems such as saturation reduction and sensitivity reduction may be avoided.

Then, the first conductive type connection region 147 is formed between the photodiode 210 and the readout circuitry 120. This may provide a relatively swift movement path of the photo charges, so that a dark current source can be minimized, and saturation reduction and sensitivity reduction can be minimized or prevented.

To this end, according to the first embodiment, the first conductive type connection region 147 for ohmic contact can be formed on a surface of the P0/N−/P− junction 140. The N+ region 147 may contact the N− region 143 by passing through the P0 region 145.

In order to inhibit the first conductive type connection region 147 from becoming a leakage source, a width of the first conductive type connection region 147 may be minimized. To this end, a plug implant may be performed after a contact hole for a first metal contact 151a is etched, but embodiments are not limited thereto. According to certain embodiments, other processes may be performed. For instance, an ion implantation pattern (not shown) can be formed exposing the region to which the first conductive type connection region 147 is to be formed, and then the first conductive type connection region 147 can be formed by using the ion implantation pattern as an ion implantation mask.

That is, according to the first embodiment, only a contact forming portion is locally doped with N+ impurities to facilitate the formation of the ohmic contact while minimizing a dark signal. In contrast, according to the related art, the entire surface of the transfer transistor source is doped with N+ impurities, so the dark signal may be increased due to the Si surface dangling bond.

Then, the interconnection 150 and an interlayer dielectric layer 160 can be formed on the first substrate 100. The interconnection 150 may include the first metal contact 151a, a first metal 151, a second metal 152, a third metal 153, and a contact plug connecting the metals to each other, but embodiments are not limited thereto.

For the purpose of convenience, the structure above the third metal (uppermost metal) 153 is illustrated in a three-dimensional shape in FIG. 4.

As shown in FIG. 4, the uppermost contact plug 154a is prepared in the form of a wall, which is bent at least one time with respect to the third metal 143 and sequentially connected to the uppermost metals of adjacent pixels in the photodiode area.

Since the electric signal generated from the photodiode 210 is transferred to the first substrate 100 through the common contact plug 154a having the wall configuration, signal collision may be avoided when the readout circuit 120 forms an image.

According to an embodiment, the select transistors Sx of the readout circuitry 120 for each pixel are sequentially operated at a predetermined time interval, so pixel signals transferred to the main processor may not be mixed with each other even if the uppermost contact plug 154a is commonly used.

In this manner, since the top surface of the uppermost contact plug 154a having the wall configuration is electrically connected to the photodiode 210 bonded onto the uppermost contact plug 154a, the signals can be stably transferred even if a defect occurs at some connection parts.

In addition, it is not necessary to form the upper contact plug on the photodiode of each pixel. That is, the uppermost contact plug can be linearly configured through a photoresist pattern process, an etching process, a gap-fill process, and polishing process, so that the process can be simplified.

Figure 5:
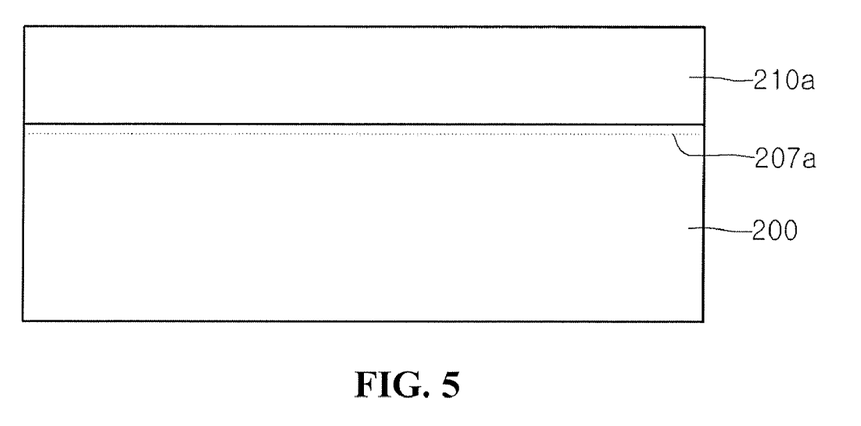
FIG. 5 is a cross-sectional view of a donor substrate of an embodiment showing the structure of an image sensor after a crystalline semiconductor layer has been formed.

FIG. 5 is a cross-sectional view of a second substrate of an embodiment.

As shown in FIG. 5, a crystalline semiconductor layer 210a is formed on the second substrate (donor substrate) 200. According to an embodiment, the photodiode 210 is formed on the crystalline semiconductor layer 210a. Therefore, according to embodiments, the three-dimensional image sensor equipped with an image sensing device positioned over the readout circuitry can be provided, which can improve the fill factor. In addition, since the image sensing device is formed in the crystalline semiconductor layer, defects in the image sensing device can be inhibited.

For instance, the crystalline semiconductor layer 210a may be formed on the second substrate 200 through epitaxial growth. Then, hydrogen ions are implanted onto the boundary between the second substrate 200 and the crystalline semiconductor layer 210a, thereby forming a hydrogen ion implantation layer 207a. In another embodiment, the implantation of hydrogen ions may be performed after an ion implantation for forming the photodiode 210.

Figure 6:
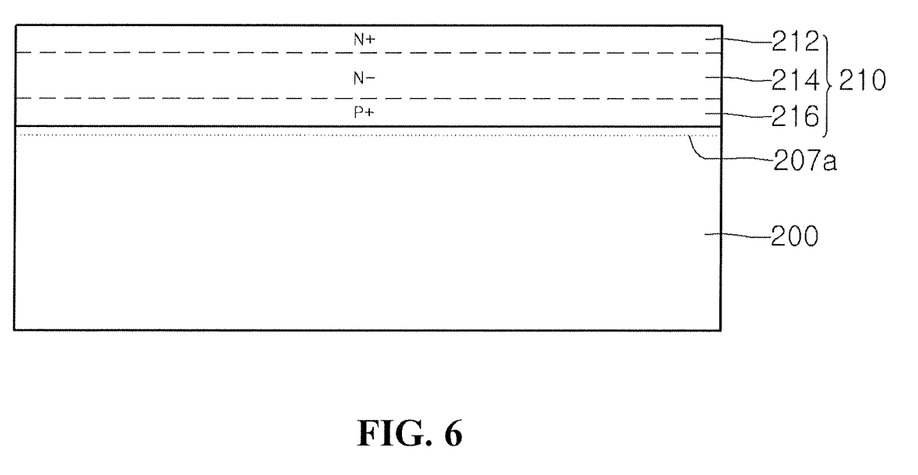
FIG. 6 is a cross-sectional view of a donor substrate of an embodiment showing the structure of an image sensor after a photodiode has been formed.

FIG. 6 is a cross-sectional view of an embodiment showing the structure of the image sensor after the photodiode 210 has been formed.

As shown in FIG. 6, a photodiode 210 is formed on the crystalline semiconductor layer 210a through ion implantation. For instance, a second conductive type conduction layer 216 (later connected as the ground) may be formed at a lower portion of the crystalline semiconductor layer 210a near the boundary between the crystalline semiconductor layer 210a and the second substrate 200. For example, a first blanket-ion implantation is performed over the entire surface of the second substrate 200 without a mask, thereby forming a high-concentration second conductive type conduction layer 216 at the lower portion of the crystalline semiconductor layer 210a. In this embodiment, the second conductive type is P-type and the first conductive type is N-type.

Then, a first conductive type conduction layer 214 (later serving as a light receiving portion) is formed on the second conductive type conduction layer 216. For instance, a blanket-ion implantation is performed over the entire surface of the second substrate 200 without a mask, thereby forming the first conductive type conduction layer 214.

After that, according to an embodiment, a high concentration first conductive type conduction layer 212 may be formed on the first conductive type conduction layer 214. For example, a blanket-ion implantation is performed over the entire surface of the second substrate 200 without a mask, thereby forming the high concentration first conductive type conduction layer 212. The high concentration first conductive type conduction layer 212 contributes to the ohmic contact.

FIG. 7 is a cross-sectional view of an embodiment showing the structure of the image sensor after the first substrate 100 has been bonded to the second substrate 200.

As shown in FIG. 7, the second substrate 200 is turned over and bonded to the first substrate 100 such that the photodiode 210 may contact the interlayer dielectric layer 160. Before the first substrate 100 is bonded to the second substrate 200, a surface energy of the bonding surfaces can be increased through activation of plasma. In order to enhance the bonding strength, an insulating layer or a metal layer can be disposed on a bonding interface.

Then, the hydrogen ion implantation layer 207a may be changed into a hydrogen gas layer (not shown) by performing heat treatment to the second substrate 200. After that, on the basis of the hydrogen gas layer, the second substrate 200 is partially removed by using a blade and the photodiode 210 remains such that the photodiode 210 can be exposed as shown in FIG. 1.

Trenches (not shown) can then be formed to divide the photodiode 210 according to pixels. The trenches are filled with insulating layer, thereby forming a PTI (pixel trench isolation). Then, a top electrode (not shown), a color filter (not shown), and the like can be formed through subsequent processes.

Hereinafter, an image sensor according to a second embodiment will be described.

Figure 8:
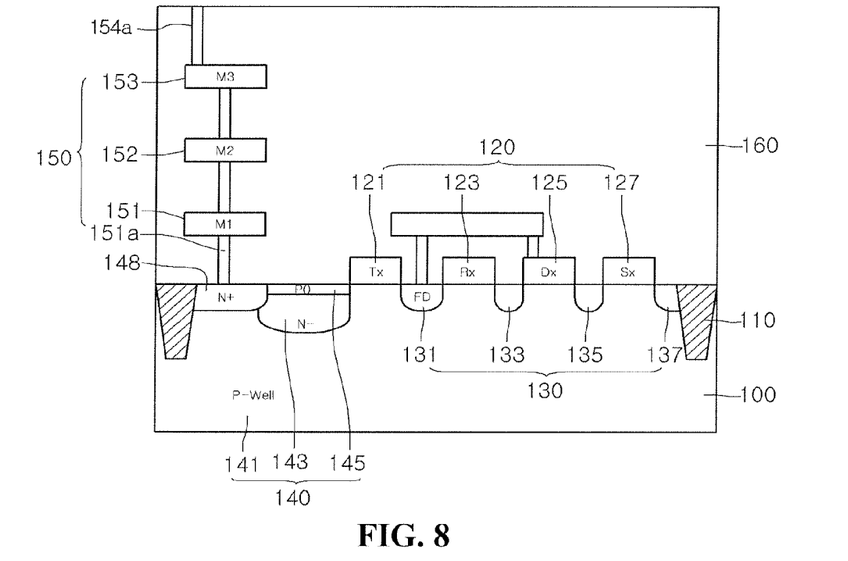
FIG. 8 is a cross-sectional view showing the structure of an image sensor according to a second embodiment.

FIG. 8 is a cross-sectional view showing the structure of an image sensor according to a second embodiment.

The image sensor according to the second embodiment includes readout circuitry 120 formed on the first substrate 100, an electric junction area 140 formed on the first substrate 100 while being connected to the readout circuitry 120, an interconnection 150 electrically connected to the electric junction area 140, and an image sensing device (not shown) on the interconnection 150.

The technical features described with respect to the first embodiment and FIGS. 2 and 4-7 can be adopted in the second embodiment and detailed descriptions of such features will be omitted in order to avoid redundancy.

Different from the first embodiment, according to the second embodiment, a first conductive type connection region 148 is formed at one side of the electric junction area 140.

According to the first embodiment, the N+ connection region 147 can be formed in the P0/N−/P− junction area 140 for ohmic contact. At this time, the process for forming the N+ connection region 147 and the first metal contact 151a may become a leakage source. That is, since reverse bias voltage is applied to the P0/N−/P− junction area 140 upon operation, an electric field may be generated on the surface of the substrate. A crystal defect generated under the electric field during the process for forming the contact may become the leakage source.

In addition, the electric field is additionally generated by the N+/P0 junction areas 147 and 145 when the N+ connection region 147 is formed on the surface of the P0/N−/P− junction area 140, so a leakage source may be further created.

To address this possible problem, the second embodiment suggests a layout, in which the first contact plug 151a is formed on an active area having the N+ connection region 148 formed without being doped through the P0 layer, and the first contact plug 151a is electrically connected to the N−junction area 143 through the N+ connection region 148.

According to the second embodiment, the electric field is not generated on the surface of the silicon substrate, so the dark current can be reduced in the three-dimensional integrated CIS.

The structure and the manufacturing method for the photodiode 210 of the second substrate 200 and the contact plugs 154a according to the first embodiment can be adopted in the second embodiment.

Figure 9:
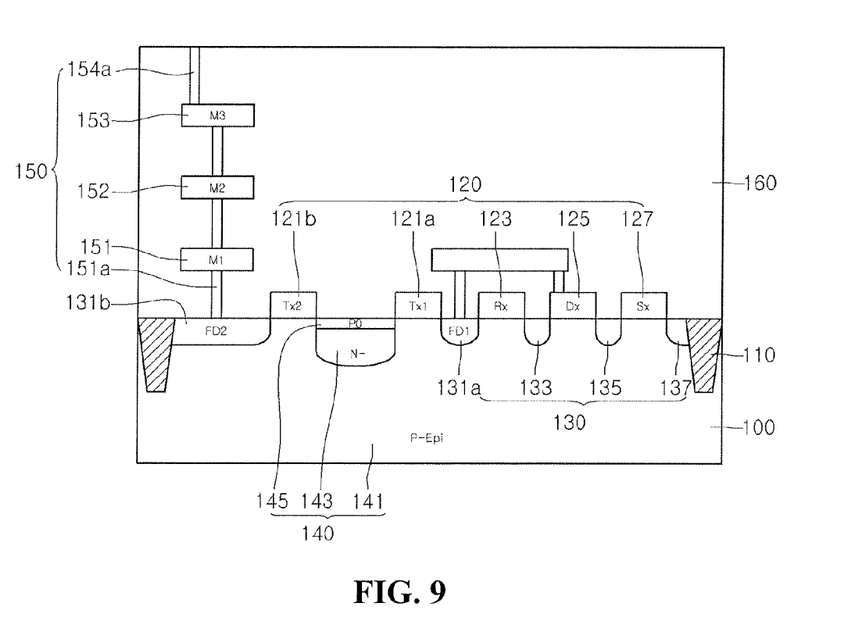
FIG. 9 is a cross-sectional view showing the structure of an image sensor according to a third embodiment.

FIG. 9 is a cross-sectional view showing the structure of the image sensor according to a third embodiment.

The image sensor according to the third embodiment may include readout circuitry 120 formed on the first substrate 100, an electric junction area 140 formed on the first substrate 100 and electrically connected to the readout circuitry 120, an interconnection 150 electrically connected to the electric junction area 140, and an image sensing device (not shown) formed on the interconnection 150.

The technical features of the first embodiment can be adopted in the third embodiment.

Hereinafter, the image sensor according to the third embodiment will be described, in which explanation about the elements and structures described in the first and second embodiments will be omitted in order to avoid redundancy.

The method for forming the readout circuitry 120 on the first substrate 100 will be described in detail in the third embodiment.

According to the third embodiment, first and second transistors 121a and 121b are formed on the first substrate 100. For instance, the first and second transistors 121a and 121b may be first and second transfer transistors, respectively, but embodiments are not limited thereto. The first and second transistors 121a and 121b can be sequentially or simultaneously formed.

Then, an electric junction area 140 is formed between the first and second transistors 121a and 121b. For instance, the electric junction area 140 may include the PN junction, but the embodiment is not limited thereto.

The PN junction 140 of this embodiment may include a first conductive type ion implantation layer 143 formed on a second conductive type well 141 or second conductive type epitaxial layer, and a second conductive type ion implantation area 145 formed on the first conductive type ion implantation area 143.

For example, as shown in FIG. 9, the PN junction area 140 may include the P0-/N−/P− junction, but the embodiment is not limited thereto.

A high-concentration first conductive type connection area 131b is formed at one side of the second transistor 121b such that a high-concentration first conductive type connection area 131b can be connected to the interconnection 150. The high-concentration first conductive type connection area 131b is a high-concentration ion implantation area serving as a second floating diffusion area 131b, but the embodiment is not limited thereto.

In the embodiment, the readout circuitry includes a first section to transfer electrons generated from the photodiode on the upper portion of the chip to the N+ junction area 131b of the silicon substrate and a second section to transfer the electrons from the N+ junction area 131b to the N− junction area 140, so that the 4-transistor operation is possible.

As shown in FIG. 9, according to the third embodiment, the P0/N−/P− junction area 140 is separated from the N+ junction area 131b to address the following.

For instance, if the N+ doping and the contact etch are performed on the P/N/P junction of the P0/N−/P− junction area 140, dark current may be generated due to the N+ junction area 131*b* and contact etch damage. In order to address the above problem, the P0/N−/P− junction area 140 is separated from the N+ junction area 131*b*.

That is, the N+ doping and the contact etch performed on the surface of the P/N/P junction may become the leakage source. Thus, the contact is formed on the N+ junction area 131*b* to inhibit the leakage source.

Since the gate of the second transistor 121*b* can be turned on during the signal readout, the electrons generated from the photodiode 210 on the upper portion of the chip are transferred to the node of the first floating diffusion area 131*a* through the P0/N−/P− junction area 140, so CDS (correlated double sampling) is possible.

The structure and the manufacturing method for the photodiode 210 of the second substrate 200 and the contact plugs 154*a* according to the first embodiment can be adopted in the third embodiment.

The embodiments may have one or more of the following effects.

First, the contact structure between the photodiode of the donor substrate and the metal structure of the main substrate can be improved, so that the current transfer characteristics can be enhanced.

Second, since the current transfer characteristics can be enhanced between the donor substrate and the main substrate, the operational reliability of the image sensor can be improved and the product yield can be increased.

Third, since a potential difference is generated between the source/drain areas of the transfer transistor Tx, the photo charges can be fully dumped.

Fourth, a charge connection area is formed between the photodiode and the readout circuitry to provide a swift movement path of the photo charges, so that a dark current source can be minimized, and saturation reduction and sensitivity reduction can be minimized or prevented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   readout circuitry on a first substrate;
   an interlayer dielectric layer including at least one metal and at least one contact plug electrically connected to the readout circuitry; and
   an image sensing device formed on a second substrate, bonded to the interlayer dielectric layer, and provided with a first conductive type conduction layer and a second conductive type conduction layer directly formed on the first conductive type conduction layer,
   wherein an uppermost contact plug of at least one contact plug has a wall structure extending from an uppermost metal, wherein the top surface of the uppermost contact plug makes contact with the image sensing device and is electrically connected to an adjacent image sensing device and an adjacent uppermost metal of an adjacent pixel wherein the uppermost contact plug extends from the uppermost metal and is bent at least one time so as to connect with the adjacent image sensing device and the adjacent uppermost metal of the adjacent pixel.

2. The image sensor according to claim 1, wherein the image sensing device further comprises a high-concentration first conductive type conduction layer below the first conductive type conduction layer, wherein the high-concentration first conductive type conduction layer contacts the top surface of the uppermost contact plug.

3. The image sensor according to claim 1, further comprising an electric junction area formed on the first substrate to electrically connect the readout circuitry to a lowest contact plug of at least one contact plug.

4. The image sensor according to claim 3, further comprising a first conductive type connection area connected between the electric junction area and the lowest contact plug to electrically connect the lowest contact plug to the electric junction area.

5. The image sensor according to claim 4, wherein the first conductive type connection area is formed at one side of the electric junction area.

6. The image sensor according to claim 3, wherein the electric junction area comprises:
   a first conductive type ion implantation area on the first substrate; and
   a second conductive type ion implantation area on the first conductive type ion implantation area.

7. The image sensor according to claim 3, wherein the readout circuitry of the first substrate comprises first and second transistors formed on the first substrate, and wherein the electric junction area is formed between the first and second transistors.

8. The image sensor according to claim 7, further comprising a first conductive type second connection area formed at one side of the second transistor, wherein the first conductive type second connection area is connected to the lowest contact plug.

9. The image sensor according to claim 1, wherein the readout circuitry comprises a select transistor configured to operate at a predetermined time interval corresponding to each pixel to allow signals of the image sensing device to be sequentially transferred through the uppermost contact plug.

* * * * *